(12) United States Patent
Levinson et al.

(10) Patent No.: US 6,593,035 B1
(45) Date of Patent: *Jul. 15, 2003

(54) PELLICLE FOR USE IN SMALL WAVELENGTH LITHOGRAPHY AND A METHOD FOR MAKING SUCH A PELLICLE USING POLYMER FILMS

(75) Inventors: Harry J. Levinson, Saratoga, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 19 days.

This patent is subject to a terminal disclaimer.

(21) Appl. No.: 09/771,236

(22) Filed: Jan. 26, 2001

(51) Int. Cl.$^7$ .............................. G03F 9/00; A47G 1/12
(52) U.S. Cl. .............................................. 430/5; 428/14
(58) Field of Search .................... 430/5, 322, 323, 430/324; 378/34, 35; 428/14

(56) References Cited

U.S. PATENT DOCUMENTS

| | | | |
|---|---|---|---|
| 4,608,326 A | 8/1986 | Neukermans et al. | |
| 4,634,270 A | 1/1987 | Yokoo et al. | 355/125 |
| 5,729,325 A | 3/1998 | Kashida | 355/30 |
| 5,793,836 A | * 8/1998 | Maldonado et al. | 378/35 |
| 5,809,103 A | 9/1998 | Smith et al. | 378/35 |
| 5,989,754 A | 11/1999 | Chen et al. | 430/5 |
| 6,063,208 A | 5/2000 | Williams | 134/34 |
| 6,101,237 A | 8/2000 | Miyachi et al. | 378/35 |
| 6,180,292 B1 | 1/2001 | Acosta et al. | 430/5 |
| 6,197,454 B1 * | 3/2001 | Yan | 430/5 |
| 6,280,886 B1 | 8/2001 | Yan | 430/5 |

FOREIGN PATENT DOCUMENTS

| | | |
|---|---|---|
| EP | 0 893 736 A1 | 1/1999 |
| EP | 0 907 106 A1 | 4/1999 |
| EP | 0 940 718 A2 | 9/1999 |
| EP | 0 989 457 A2 | 3/2000 |
| EP | 0 989 457 A3 | 3/2000 |
| EP | 1 045 288 A2 | 10/2000 |
| EP | 1 045 288 A3 | 5/2001 |
| EP | 0 940 718 A3 | 9/2001 |
| EP | 1 158 361 A1 | 11/2001 |
| EP | 1 164 431 A1 | 12/2001 |
| WO | WO 01 37043 A1 | 5/2001 |
| WO | WO 01 40870 A1 | 6/2001 |

OTHER PUBLICATIONS

"Optical Microlithography III: Technology for the Next Decade", Harry L. Stover, Mar. 14–15, 1984, The International Society for Optical Engineering, pp 138–146.

Patent Abstracts of Japan, vol. 009, No. 054 (P–340), Mar. 8, 1985 & JP 59 191039 A (Hitachi Seisakusho KK), Oct. 30, 1984 abstract.

* cited by examiner

*Primary Examiner*—S. Rosasco
(74) *Attorney, Agent, or Firm*—Foley & Lardner

(57) ABSTRACT

A pellicle utilizes a thin film attached to a frame. The film is relatively transparent to radiation. The frame is coupled to a periphery of the film and is exclusive of the center portion of the film. The pellicle can be manufactured by growing a relatively transparent film on a silicon substrate and removing the substrate to expose at least a portion of the relatively transparent film.

20 Claims, 2 Drawing Sheets

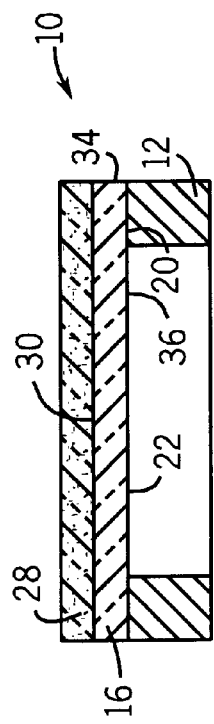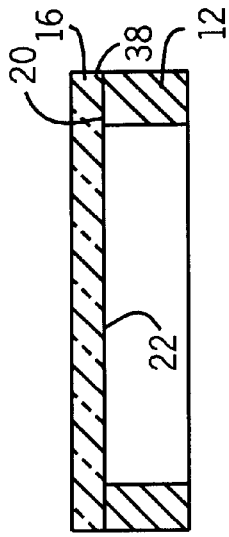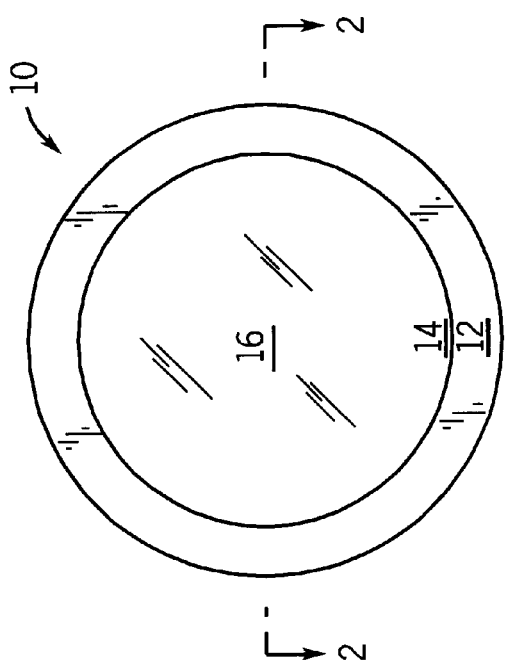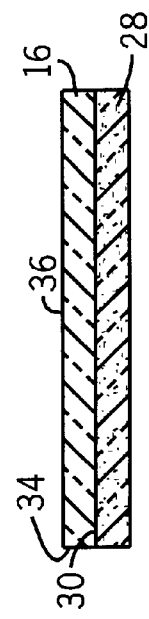

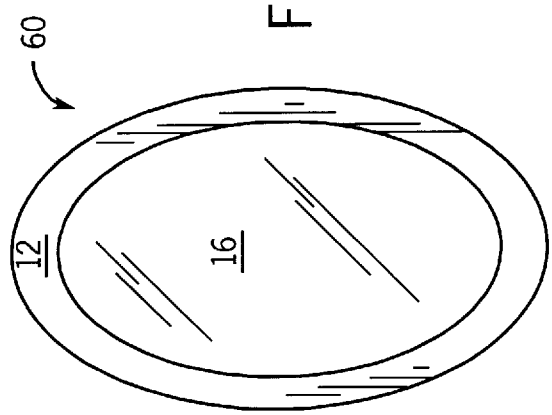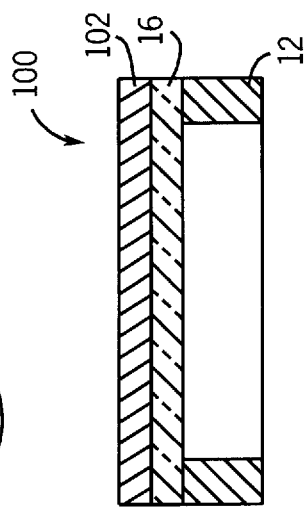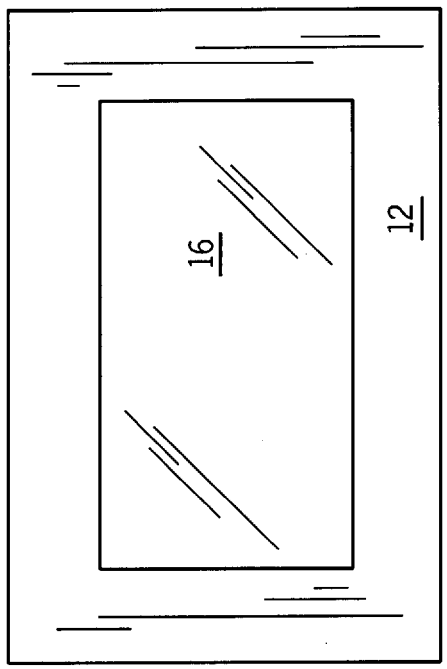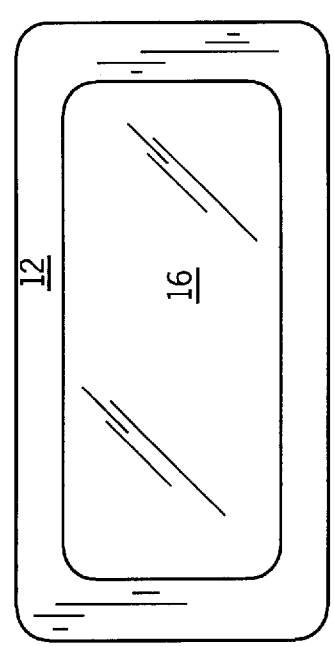

PELLICLE FOR USE IN SMALL WAVELENGTH LITHOGRAPHY AND A METHOD FOR MAKING SUCH A PELLICLE USING POLYMER FILMS

CROSS REFERENCE TO RELATED APPLICATIONS

The present invention is related to application Ser. No. 09/770,736, filed on an even date herewith, by Levinson et al., entitled "A Pellicle for Use in EUV Lithography and a Method for Making such a Pellicle" and U.S. patent application Ser. No. 09/770,733, filed on an even date herewith, by Levinson et al., entitled "A Pellicle For Use In Small Wavelength Lithography And A Method For Making Such A Pellicle".

FIELD OF THE INVENTION

The present invention relates generally to integrated circuit (IC) fabrication equipment. More particularly, the present invention relates to a pellicle and a method of manufacturing a pellicle.

BACKGROUND OF THE INVENTION

Semiconductor fabrication techniques often utilize a mask or reticle. Radiation is provided through or reflected off the mask or reticle to form an image on a semiconductor wafer. The wafer is positioned to receive the radiation transmitted through or reflected off the mask or reticle. The image on the wafer corresponds to the pattern on the mask or reticle. The radiation can be light, such as ultra-violet light, vacuum ultra-violet (VUV) light and deep ultra violet light. The radiation can also be x-ray radiation, e-beam radiation, etc.

Generally, the image is utilized on the wafer to pattern a layer of material, such as, photoresist material. The photoresist material can be utilized to define doping regions, deposition regions, etching regions, or other structures associated with an integrated circuit (IC). A conventional lithographic system is generally utilized to project the image to the wafer. For example, a conventional lithographic system includes a source of radiation, an optical system, and the reticle or photomask. The source of radiation provides radiation through the optical system and through or off of the mask or reticle. A pellicle can be employed between the light source and the wafer (i.e., between the mask and the wafer).

Generally, conventional fabrication systems which utilize wavelengths of 193 nm or more include the pellicle to seal off the mask or reticle to protect it from airborne particles and other forms of contamination. Contamination on the surface of the reticle or mask can cause manufacturing defects on the wafer. For example, pellicles are typically used to reduce the likelihood that particles might migrate into a stepping field of a reticle in a stepping lithographic system. If the reticle or mask is left unprotected, the contamination can require the mask or reticle to be cleaned or discarded. Cleaning the reticle or mask interrupts valuable manufacturing time and discarding the reticle or mask is costly. Replacing the reticle or mask also interrupts valuable manufacturing time.

The pellicle is generally comprised of a pellicle frame and a membrane. The pellicle frame may be comprised of one or more walls which is securely attached to a chrome side of the mask or reticle. Pellicles have also been employed with antireflective coatings on the membrane material.

The membrane is stretched across the metal frame and prevents the contaminates from reaching the mask or reticle. The membrane is preferably thin enough to avoid the introduction of aberrations, and to be optically transparent and yet strong enough to be stretched across the frame. The optical transmission losses associated with the membrane of the pellicle can affect the exposure time and throughput of the lithographic system. The optical transmission losses are due to reflection, absorption and scattering. Stretching the membrane ensures that it is flat and does not adversely affect the image projected onto the wafer.

The membrane of the pellicle generally covers the entire printable area of a mask or reticle and is sufficiently durable to withstand mild cleaning and handling. Conventional membrane materials are preferably configured to be stable enough to retain their shape over long periods of time and many exposures to flashes of radiation. Membrane materials are typically thin polymer films that do not appreciably change the optical projection of the lithographic system and that do not contribute to pattern misplacement and other imaging aberrations. The membrane materials should also be inexpensive enough to be cost effective. The membrane can be manufactured from nitrocellulose and have a thickness of 1 to 15 micrometers (typically approximately 2.9 micrometers).

Other pellicle membrane materials include polymers, such as, flouropolymers or cellulose acetate which can be coated with one or more layers of fluoropolymers (anti-reflective coatings (ARC)). The average transmissions of a pellicle with a 2.9 micrometer thick nitrocellulose membrane and an anti-reflective coating can be approximately 99 percent at wavelengths of 350–450 nm. Another conventional pellicle material includes Mylar® polymer material.

Small particles that adhere to the pellicle surface (the membrane) generally do not significantly obstruct light directed to the surface of the wafer. The metal frame ensures that a minimum stand-off distance from the mask is provided to ensure that no more than a 10% reduction in light intensity on the wafer surface is achieved for a particle of a particular size. The pellicle also keeps particles out of the depth-of-field of the lens. Thus, the stand-off distance prevents contaminates from being effectively imaged onto the wafer.

Adhesive materials can be utilized to attach the pellicle membrane to the frame and the frame to the reticle or mask. Compressive material such as silicone or other natural and synthetic rubbers can be utilized as adhesives.

Membranes made of nitrocellulose, and Mylar® have limited usefulness in deep UV applications because both exhibit strong absorption near 300 nanometers. In addition, these materials can change color when exposed to deep UV light. Conventional membrane materials, such as, thin polymer films, are not transparent after repeated use at vacuum ultraviolet (VUV) (100–180 nm) wavelengths. For example, VUV radiation provided through the pellicle can discolor and degrade the membrane.

Thus, there is a need for a pellicle which does not utilize conventional materials. Further still, there is a need for a pellicle which is more durable or stable than conventional materials. Further still, there is a need for a pellicle optimized for use in deep UV applications or advanced lithography, such as, VUV applications. Even further still, there is a need for a method of manufacturing a pellicle which does not result in a membrane including conventional materials.

SUMMARY OF THE INVENTION

An embodiment relates to a thin film pellicle for integrated circuit fabrication equipment. The pellicle includes a film relatively transparent to radiation having a wavelength of less than 180 nanometers and a frame. The film has a periphery and a center portion. The frame is coupled to the periphery of the film and is exclusive of the center portion. Radiation can be transmitted through the center portion.

Another embodiment relates to a pellicle for fabrication equipment. The pellicle includes a means for allowing radiation to pass and a frame coupled to the means for allowing the radiation to pass. The means for allowing radiation to pass includes silicon.

Yet another embodiment relates to a method of manufacturing a pellicle. The method includes forming a film on a polymer substrate and attaching a frame to the film. The polymer substrate is removed from the film.

Still another embodiment relates to a method of forming a pellicle relatively transparent to VUV radiation. The method includes growing a relatively transparent film on a polymer substrate and removing the polymer substrate.

BRIEF DESCRIPTION OF THE DRAWINGS

Exemplary embodiment will hereafter be described with reference to the accompanying drawings, wherein like numerals denote like elements, and:

FIG. 1 is a bottom view of a pellicle in accordance with an exemplary embodiment;

FIG. 2 is a cross-sectional view of the pellicle illustrated in FIG. 1 about line 2—2;

FIG. 3 is a cross-sectional view of the pellicle illustrated in FIG. 2, showing a film formation step;

FIG. 4 is a cross-sectional view of the pellicle illustrated in FIG. 3, showing a frame attachment step;

FIG. 5 is a bottom view of an alternative exemplary embodiment of a pellicle similar to the pellicle illustrated in FIG. 1, the pellicle of the alternative embodiment has a rectangular shape;

FIG. 6 is a bottom view of another alternative exemplary embodiment of a pellicle similar to the pellicle illustrated in FIG. 1, the pellicle of the another alternative embodiment has a rectangular shape with rounded corners;

FIG. 7 is a bottom view of still another alternative exemplary embodiment of a pellicle similar to the pellicle illustrated in FIG. 1, the pellicle of the still another embodiment has an oval shape; and FIG. 8 is a bottom view of yet still another alternative exemplary embodiment of a pellicle similar to the pellicle described in FIG. 1, the pellicle includes an anti-reflective coating.

DETAILED DESCRIPTION OF PREFERRED EXEMPLARY EMBODIMENTS

With reference to FIG. 1, a pellicle 10 is provided for use with semiconductor fabrication equipment. Preferably, pellicle 10 can be utilized in vacuum ultraviolet (VUV) lithography wherein radiation having a wavelength of less than 180 nm is utilized (preferably between 100 and 180 nm). For example, radiation or ultraviolet light at a wavelength of 157 nm can be provided through pellicle 10.

Pellicle 10 can be utilized in various types of lithographic systems and equipment. For example, pellicle 10 can be placed between optical components and the reticle or mask.

With reference to FIGS. 1 and 2, pellicle 10 includes a frame 12 and a film 16. Pellicle 10 is shown as a circularly-shaped pellicle, although any shape appropriate for semiconductor or integrated circuit (IC) fabrication equipment is possible.

Film 16 is preferably a thin film or layer which is relatively transparent to radiation, such as, VUV radiation. The term "relatively transparent" in this application refers to sufficient transmission of light for appropriate functioning of lithographic processes (e.g., sufficiently transparent for VUV applications). For example, film 16 must allow sufficient light so that photoresist material can be patterned on a semiconductor wafer in accordance with a reticle or mask. Film 16 is also preferably a material that is relatively robust or stable at VUV wavelengths and relatively flat and smooth so that significant optical distortion is not caused by film 16.

Film 16 is preferably a 0.5–2.0 micron thick silicon dioxide ($Sio_2$) or a 0.5–2.0 micron thick silicon nitride ($Si_3N_4$) layer. Film 16 is most preferably approximately 1 micron thick. The thickness is chosen to maximate transmission. Silicon dioxide and silicon nitride are relatively transparent at VUV wavelengths and are robust and stable enough to withstand multiple exposures to such radiation. Alternatively, other thicknesses of film 16 are possible.

Film 16 is preferably thin enough to allow sufficient amount of light transmission and yet thick enough to have sufficient stability. Film 16 is preferably manufactured from a material which shows stability over a large number of exposures to radiation, unlike conventional pellicle membranes.

Film 16 is preferably under tensile stress. By providing tensile stress to film 16, adverse effects associated with gravity are reduced. For example, gravity can cause film 16 to bend, thereby adversely effecting the image associated with the reticle or photomask. The tensile stress is provided in a radial direction (laterally). Tensile stress refers to a lateral force or tension less than the maximum film 16 can withstand without breaking. Film 16 can also include fluorine for optical stability.

Film 16 is disposed on top of frame 12. Frame 12 is preferably ring-shaped and attached to a periphery 20 of film 16. A center portion 22 of film 16 is exclusive of frame 12.

Frame 12 can be a plastic material or a metal material. Preferably, frame 12 is an anodized aluminum structure. Alternatively, frame 12 can be ceramic or glass. Frame 12 can be an ARPA-NIST standard frame. Frame 12 can be a Pyrex® material to facilitate bonding to film 16. Frame 12 provides structural support for pellicle 10 and provides a structure for attaching pellicle 10 to the mask or reticle. The outer diameter of film 16 and frame 12 can be equal.

Pellicle 10 can be variety of sizes depending upon application parameters. For example, pellicle 10 may have a diameter of 120 mm, 150 mm, or even 300 mm or more. Application parameters and semiconductor tool requirements can effect the required dimensions for pellicle 10. Pellicle 10 can also be a variety of shapes. One preferred shape for pellicle 10 is a square or rectangle. The area of pellicle 10 (27×22×25) is typically 25 times larger than the wafer filed size which can be 22 mm×27 mm.

The thicknesses of frame 12 and film 16 are designed in accordance with the optical system associated with the lithographic tools. The thicknesses of film 16 and frame 12 are designed to provide the proper standoff distance. With typical depths-of-focus less than 1 mm, millimeter stand-offs are expected to blur the image of the particles significantly. The requirements of pellicles go beyond blurring the images of particulate defects. Pellicle stand-offs must be large enough to prevent defects from reducing the light intensity of the desired mask patterns significantly. Theoretical studies have shown that image intensities are not affected by amounts greater than 10% as long as the pellicle stand-off is at least as large as $$T_0 = \frac{M}{2NA\varepsilon_0}d$$

where M is the lens reduction, NA is the numerical aperture of the lens, $\varepsilon_0$ is a function of the normalized defect (e.g., $\varepsilon_0=\frac{1}{8}$) and d is the diameter of the particle on the pellicle. Stand-off distances are discussed in A. Flamholz, "An Analysis of Pellicle Parameters for Step-and-Repeat Projection," SPIE Vol. 470, pp. 138–146, 1984.

The thickness of frame 12 can be any conventional standard thickness for frames. Preferably, the thickness of film 16 is chosen to maximize light transmission and uniformity. Film 16 can be coupled with an antireflective coating (ARC) as discussed below with reference to FIG. 8.

With reference to FIGS. 1–4, an exemplary method for fabricating pellicle 10 is described below as follows. As discussed above, pellicle 10 is manufactured so that conventional membrane materials, which can be subject to discoloration over multiple use in the VUV frequency range, do not exist in the end product.

In FIG. 3, a substrate material 28, such as, silicon material, is provided as a substrate. Material 28 can be a variety of shapes, thicknesses and sizes. Material 28 can be cut to particular sizes. Preferably, material 28 is the thickness of a SEMI standard silicon wafer (e.g., 200 millimeters thick). A top surface 30 of material 28 is preferably relatively flat and smooth. Surface 30 can be subject to a polishing process. Material 28 can also be any relatively smooth and flat material upon which film 16 can be grown or deposited. Material 28 provides a support for the formation and handling of film 16.

Film 16 can be grown or deposited on material 28 by semiconductor fabrication techniques, such as, chemical vapor deposition (CVD) low temperature (LT), growth techniques, etc. For example, film 16 can be deposited by sputter deposition on a top surface 30 of material 28. Film 16 comprised of, such as, $Si_3N_4$ or $SiO_2$ material, can be deposited or grown. During growth or deposition, fluorine can be utilized to increase the stability of film 16. Film 16 can be subject to a polishing process. As discussed below, material 28 should have different etching properties than film 16 so that it can be selectively etched or removed.

Substrate material 28 is preferably silicon. For example, material 28 can be SEMI standard silicon wafer. Material 28 can be cut to variety of shapes and sizes.

With reference to FIG. 4, frame 12 is attached to film 16. Frame 12 can be attached by an adhesive, such as, silicone or bonded. Alternatively, mechanical systems can attach frame 12 to film 16.

Frame 12 can be attached to a surface 36 of film 16. Film 16 is flipped from its orientation in FIG. 3 for attachment to frame 12. According to another embodiment, frame 12 can be attached to a side 34 of film 14. Frame 12 provides structural stability for film 16.

With reference to FIG. 2, after film 16 is provided on frame 12, material 28 is removed from film 16. Preferably, material 28 is etched entirely from film 16. Alternatively, the etching can only expose center portion 22 of film 16, thereby leaving material 28 at periphery 20 of film 16.

A variety of removal processes can be utilized to remove material 28 from surface 30 of film 16. Preferably, a solvent selective to material 28 (e.g., polyester) is utilized. For example, an oxygen plasma or ozone etch can be utilized. Alternative etching chemistries can be utilized. Further, dry etching, mechanical and other removal processes can be utilized to expose center portion 22 of film 16.

As described above, material 28 can be entirely removed from film 16. However, if only center portion 22 is exposed, a lithographic process can be utilized to define portion 22. Preferably, portion 22 is large enough so that substrate 14 does not interfere with light provided through pellicle 10. The lithographic processes do not need significant resolution as long as center portion 22 covers the entire focus area of the lens associated with the lithographic equipment.

Substrate material 28 is preferably provided under tensile stress as film 16 is deposited or grown. Material 28 can be placed under tensile stress by the choice of deposition conditions. In this way, material 28 causes film 16 to be under tensile stress (to be stretched out), thereby relieving some of the effects of gravity.

According to another embodiment, material 28 can be removed before frame 12 is attached. According to yet another alternative embodiment, a ring-like portion of material 28 can be sandwiched between film 16 and frame 12. In this embodiment, material 18 is etched to remove center portion 36 and frame 12 is attached to material 18.

With reference to FIG. 5, a rectangular-shaped pellicle 40, similar to pellicle 10 (FIG. 1) is shown. For example, pellicle 40 can have dimensions of approximately 120 millimeters by 150 millimeters. Pellicle 40 includes frame 12 and film 16. With reference to FIG. 6, a pellicle 50 is shown having a rectangular shape with rounded edges. Pellicle 50 is similar to pellicle 10 (FIG. 1) and includes frame 12 and film 16. With reference to FIG. 7, a pellicle 60 has an oval shape and is similar to pellicle 10 (FIG. 1). Pellicle 60 includes frame 12 and film 16. Pellicles 40, 50, and 60 are manufactured according to the process described above with reference to FIGS. 1–4.

With reference to FIG. 8, a pellicle 100 is similar to pellicle 10 (FIG. 1). Pellicle 100 includes frame 12 and film 16. In addition, pellicle 100 includes an antireflective coating (ARC) 102 provided on film 16. Alternatively, antireflective coating 102 can be provided between film 16 and substrate 14. Coating 102 can be variety of materials including calcium fluoride ($CaF_2$).

Conventional thicknesses can be used for coating 102. Preferably, coating 102 has a thickness equal to an integer multiple of one fourth the wavelength of light utilized by the tool in which pellicle 100 is employed ($n*\lambda/4$, where n is an integer and $\lambda$ is the wavelength of light transmitted through pellicle 100). Pellicle 100 can employ more than one layer 102. An exemplary thickness for coating 102 is approximately $1\mu$ for VUV applications.

Pellicle 100 is manufactured in a process similar to the process described above with reference to FIGS. 1–4. Coating 102 is preferably provided before frame 12 is attached and before material 28 (FIG. 3) is removed. Coating 102 is provided on the surface of film 16 that is opposite material 28. Alternatively, coating 102 can be provided after frame 12 is attached or just after substrate 28 is removed.

It is understood that although the detailed drawings, specific examples, and particular values given provide exemplary embodiments of the present invention, the exemplary embodiments are for the propose of illustration only. The method and apparatus in the aforementioned embodiments are not limited to the precise details and descriptions disclosed. For example, although particular films and substrates are described, other materials can be utilized. Various changes may be made to the details disclosed without departing from the spirit of the invention which is defined by the following claims.

What is claimed is:

1. A thin film pellicle for integrated circuit fabrication equipment, the pellicle comprising:
   a film relatively transparent to radiation having a wavelength of less than 180 nanometers, the film having a periphery and a center portion the film being comprised of at least one of silicon nitride or both silicon dioxide and fluorine; and
   a frame coupled to the periphery of the film and exclusive of the center portion, whereby the radiation can be transmitted through the center portion.

2. The pellicle of claim 1, wherein the film is silicon nitride.

3. The pellicle of claim 2, wherein the frame is metal.

4. The pellicle of claim 2, wherein the frame is plastic, ceramic or glass.

5. The pellicle of claim 2, wherein the film thickness is between 0.5 and 2.0 microns.

6. The pellicle of claim 2, wherein the film is formed on a silicon substrate.

7. The pellicle of claim 6, wherein the silicon substrate is 200 mm thick.

8. The pellicle of claim 1, wherein the film is silicon dioxide.

9. A pellicle for fabrication equipment, the pellicle comprising:
   a means for allowing radiation to pass, the means for allowing radiation to pass includes a material containing at least one of silicon nitride or both silicon dioxide and fluorine; and
   a frame coupled to a periphery of the means for allowing radiation to pass.

10. The pellicle of claim 9, wherein the means for allowing includes a silicon/group V or a silicon/group VI material.

11. The pellicle of claim 9, wherein the means for allowing is formed on a polymer layer.

12. The pellicle of claim 9, wherein the frame includes silicon nitride material.

13. The pellicle of claim 9, wherein the frame is under tensile stress.

14. The pellicle of claim 9, wherein the means for allowing is under tensile stress to reduce distortion due to gravity.

15. A method of manufacturing a pellicle comprising:
    forming a film including at least one of silicon nitride or both silicon dioxide and fluorine on a substrate;
    attaching a frame to the film; and
    removing the substrate.

16. The method of claim 15, wherein the attaching step is performed after the removing step.

17. The method of claim 15, wherein the attaching step is performed before the removing step.

18. The method of claim 15, wherein the substrate is under tensile stress.

19. The method of claim 15, wherein the substrate includes silicon.

20. The method of claim 19, wherein the film is silicon nitride or silicon dioxide and fluorine.

* * * * *